(12) United States Patent
Goettert et al.

(10) Patent No.: US 7,957,144 B2
(45) Date of Patent: Jun. 7, 2011

(54) HEAT EXCHANGE SYSTEM FOR BLADE SERVER SYSTEMS AND METHOD

(75) Inventors: Carsten Goettert, Hochheim (DE); Harald Huels, Horb a.N. (DE); Hans-Guenter Kraemer, Wittlich (DE); Manfred Ries, Mainz (DE); Rolf Schaefer, Mainz (DE)

(73) Assignee: International Business Machines Corporation, Armonk, NY (US)

( * ) Notice: Subject to any disclaimer, the term of this patent is extended or adjusted under 35 U.S.C. 154(b) by 127 days.

(21) Appl. No.: 12/038,025

(22) Filed: Feb. 27, 2008

(65) Prior Publication Data

US 2008/0225478 A1 Sep. 18, 2008

(30) Foreign Application Priority Data

Mar. 16, 2007 (EP) .................................... 07104299

(51) Int. Cl.
*H05K 7/20* (2006.01)
*F28F 7/00* (2006.01)

(52) U.S. Cl. .............. 361/699; 361/679.47; 361/679.52; 361/679.53; 361/702; 361/727; 165/80.2; 165/80.3

(58) Field of Classification Search ............. 361/679.47, 361/679.52, 679.53, 699–700, 702, 704, 361/711, 724–727; 165/80.2–80.3
See application file for complete search history.

(56) References Cited

U.S. PATENT DOCUMENTS

| | | | |
|---|---|---|---|
| 4,777,561 A * | 10/1988 | Murphy et al. | ............... 361/700 |
| 6,766,817 B2 | 7/2004 | Dias da Silva | |
| 6,796,372 B2 * | 9/2004 | Bear | ........................ 165/104.21 |
| 6,918,404 B2 | 7/2005 | Dias da Silva | |
| 7,066,586 B2 | 6/2006 | Dias da Silva | |
| 7,244,398 B2 | 7/2007 | Kotary et al. | |
| 7,285,255 B2 | 10/2007 | Kadlec et al. | |
| 7,312,987 B1 * | 12/2007 | Konshak | .................. 361/679.48 |
| 7,403,384 B2 * | 7/2008 | Pflueger | ........................ 361/688 |
| 2002/0159233 A1 * | 10/2002 | Patel et al. | ..................... 361/702 |
| 2005/0068728 A1 * | 3/2005 | Chu et al. | ...................... 361/690 |
| 2006/0260787 A1 * | 11/2006 | Wu et al. | .................. 165/104.33 |
| 2008/0013283 A1 * | 1/2008 | Gilbert et al. | ................. 361/715 |
| 2008/0015531 A1 | 1/2008 | Hird et al. | |

OTHER PUBLICATIONS

Hertweck, Jurgen, "Blade Cooling System—Prototype Results and Function", Mar. 25, 2006, pp. 1-7, V02.02, Karlsruhe.
"IBM Read Door Heat eXchanger", IBM Corporation 2005, USA.

* cited by examiner

*Primary Examiner* — Zachary M Pape
(74) *Attorney, Agent, or Firm* — Matthew C. Zehrer (57) ABSTRACT

A heat exchange system for blade server systems is disclosed, wherein said blade server system contains a plurality of server blades arranged in a blade center, wherein the heat exchange system comprises first heat sink associated to each of said plurality of server blades, and whereby the first heat sink are adapted to collect heat emitted from heat emitting devices on said associated server blade; means for transferring heat from the heat emitting devices to the first heat sink; and a liquid cooled second heat sink associated to said blade center, whereby said first heat sink are connected to said second heat sink by thermal coupling.

16 Claims, 6 Drawing Sheets

HEAT EXCHANGE SYSTEM FOR BLADE SERVER SYSTEMS AND METHOD

FIELD OF THE INVENTION

The present invention relates in general to heat exchange systems. More particularly, the present invention relates to heat exchange systems for data processing devices. Still more specifically, the present invention deals with a heat exchange system, and a method for heat exchange in blade server systems.

SUMMARY

As computers grow in speed and shrink in size, power consumed within the computer per unit volume (power density) increases dramatically. Thus, it becomes essential to dissipate the heat generated by components within the computer during operation to ensure that the components remain within their normal operating temperature ranges, since otherwise the components will fail immediately or will have a significantly shorter lifetime.

One of the most common techniques of dissipating heat from a component of a computer is to directly apply a relatively high velocity air flow across the surface of the component and heatsinks to force cool the component. This raises the convective heat transfer coefficient for the surface of that component, thereby increasing the convection cooling. Most computers are provided with fans to promote force cooling, thus increasing the temperature differential between the surface of the component and the surrounding air to increase the efficiency of the heat transfer.

Of all components in a computer, the microprocessor central processing unit ("CPU") liberates the most heat during operation of the computer. It has therefore become common practice to provide a heat sink for the CPU to increase the heat-dissipating surface area for more effective cooling. In addition to the heat sink associated with the CPU, a dedicated CPU cooling fan is often used to provide force cooling and air exchange to dissipate the heat generated by the CPU.

Blade server chassis are becoming increasingly popular. In general, a blade server chassis houses a plurality of thin, modular electronic circuit boards, referred to as server blades. Each blade server includes one or more processors, memory, network controllers, and input/output (I/O) ports, and functions as a server, typically dedicated to a particular application. The blade server chassis are usually stacked within racks, with each rack holding multiple blade server chassis. In addition, each blade server chassis has at least one switch for providing communication between the server blades and external communication networks.

Blade servers may contain hot-pluggable parts. The hot-plugging technique, sometimes known as hot swapping, enables the repair or replacement of computer systems without disturbing the operation of the total system, i.e., the blades can be removed without system shutdown. However, cooling of these systems is very much complicated due to the amount of CPUs per rack. Thus, more and more so called hotspots, i.e., heat emitting devices share the same cooling flow. The particular cooling flow may have all ready reached its cooling capacity.

To satisfy these increased cooling demands, cooling systems will have to be enhanced taking into account the physical coherences. Currently, the components on the blade are cooled down after a strong heating by convection of air. Due to the enormous generation of heat, air outlet temperatures of more than 50° C. with extremely high air speeds and noise emission will result. This can be controlled by placing a water cooler directly within the air flow, which deprives the strongly warmed air of heat again.

Another cooling concept is the so called heat pipe technology, where chips, e.g., CPU, are connected to an air cooled heat sink by heat pipes. A typical heat pipe consists of a sealed hollow tube. A thermo conductive metal such as copper or aluminum is used to make the tube. The pipe contains a relatively small quantity of a "working fluid" or coolant with the remainder of the pipe being filled with vapor phase of the working fluid, all other gases being excluded.

On the internal side of the tube's side-walls a wick structure exerts a capillary force on the liquid phase of the working fluid. This is typically a sintered metal powder or a series of grooves parallel to the tube axis, but it may in principle be any material capable of soaking up the coolant. If the heat pipe has a continual slope with the heated end down, no inner lining is needed. The working fluid simply flows back down the pipe. This type of heat pipe is known as a Perkins Tube.

Heat pipes contain no moving parts and typically require no maintenance, though non-condensing gases that diffuse through the pipes walls may eventually reduce the effectiveness, particularly when the working fluid's vapor pressure is low.

The materials and coolant chosen depends on the temperature conditions in which the heat pipe must operate, with coolants ranging from liquid helium for extremely low temperature applications to mercury for high temperature conditions. However, the vast majority of heat pipes use either ammonia or water as working fluid.

The general advantage of heat pipes is their efficiency in transferring heat. When in the proper configuration, heat pipes may be a vastly better heat conductor than an equivalent cross-section of solid copper.

At least in the professional field of high-performance computers, water cooling systems become more and more accepted, their decisive advantage being particularly their high heat intake capacity which is powers of tens higher as compared to air.

With respect to blade centers, two possibilities of water cooling can be distinguished. When using rack cooling, the air is cooled by a water cooled heat exchanger before the air can leave the rack, or the air is circulated inside the rack in a closed circuit cooled by a water cooled heat exchanger. However, this method requires a high energy and special air conditioning systems.

With direct water cooling, cooling water is directly applied to the respective heat emitting device (CPU). There is either a single water circuit, or a system with primary and secondary water circuits. Such a system is disclosed in WO 2006/005325, the invention relating to a heat exchange system for electronic devices, preferably data processing devices, comprising high-performance processors or having high processor density. The heat exchange system comprises essentially a primary cooling circuit and a secondary cooling circuit, both being thermally associated to the one or more processor unit(s). The secondary cooling circuit is configured as a completely closed system, the coolant in the secondary cooling circuit being driven exclusively by mechanical or magnetic coupling with the flow drive of the primary cooling circuit.

BRIEF DESCRIPTION OF THE DRAWINGS

The invention will be described in more detail below in connection with the accompanying drawings, in which.

DETAILED DESCRIPTION

The present invention represents a novel approach to provide a hot pluggable, cost-effective system for cooling blade server systems including one or more processors, memory, network controllers, and input/output (I/O) chips.

Heat emitting devices present on the server blades, especially processors or chips, are connected to a central heat collecting point, i.e., a first or inner heat sink associated to each of the plurality of server blades, said first heat sinks being adapted to collect heat emitted from heat emitting devices on said associated server blade.

In an embodiment of the present invention, the connection is made by vapor filled pipes, so called heat pipes, made of a highly conductive material like copper. However, the connection can also be realized by massive pieces of copper or aluminum. Also a combination of heat pipes and metal pieces can be used.

The first or inner heat sink thus collects heat from the heat emitting devices present on the server blade. It can be located at any surface of the server blade. Any combination of these positions are also possible.

All heat pipes present on the respective server blade are connected to the first heat sink, which may provide good mechanical stability and may have good thermal conductivity. Thus, the first or inner heat sink may be made of a metal like copper or aluminum as a massive piece or with an integrated heat pipe or vapor chamber system which avoids hot spots on the inner heat sink or sinks. The first heat sink is a plain part, in order to be easily fixed to the server blade. The first or inner heat sink is attached to the server blade in such a way that insertion into the rack is not hindered. This offers unlimited hot-pluggability (often referred to as hot swapability), i.e., the server blade can be removed and reinstalled without system shutdown. It has to be mentioned that the first heat sink and the heat pipes do not contain any water besides the very small amount of liquid in the sealed heat pipes.

The first or inner heat sink then transfers the collected heat to a second or outer heat sink which is mounted on the blade center and is liquid cooled. The second heat sink thus collects heat from the first heat sink. It may be an integral part of the blade center or it can be built as a removable part (cool blade—see below). The second heat sink, as the first heat sink, must have good thermal conductivity and must provide good mechanical stability, e.g., copper, aluminum, etc.

The second heat sink can be made as an individual piece for each server blade. However, it is also possible to design it for a group of blades or as a single plane-like piece. Liquid cooling can be applied by added pipes for example pipes soldered to the second heat sink or integrated pipes, e.g., drilled in the body.

To improve the capability of the first or inner heat sink or of the second or outer heat sink, heat pipes that are soldered to the outer heat sink, or vapor chambers, i.e., a metal block with integrated heat pipes can be implemented. It is also possible that a part or all of the liquid that is applied to the second heat sink changes its phase from liquid to vapor, e.g., by using liquid nitrogen to achieve very low temperatures. Also the second or outer heat sink can be directly connected to the chiller and the cooling agent of the chiller thus flows through the second or outer heat sink. Accordingly, the water circulation becomes redundant and there are fewer interfaces with respect to heat transport.

The first or inner heat sink is connected to the second or outer heat sink by thermal contact, i.e., by two surfaces touching each other, etc. Therefore, no screws or thermal grease are necessary. First and second heat sinks must therefore have an applicable planar surface with regard to flatness, so that they may slide easily on each other. These planar surfaces must provide a large area of good thermal contact between both heat sinks. This thermal contact can be easily improved by spring loading one heat sink with respect to the other. This feature, again, provides unlimited hot-pluggability.

The first and second heat sinks can be used as well as a mounting guide since the electrical contacts at the rear side of the blade will have to be aligned with an accuracy of some tenths of a millimeter with respect to the blade center.

To reduce thermal stress in components and printed circuit boards that could lead to possible defects on chip level or on board level, soldering the thermal mass could be utilized in a feedback loop to regulate the temperature on the board as well as on the chips. A regulation of the liquid flow through the system will allow to increase or to decrease the temperature to keep the hot spots at a constant temperature. The thermal mass of the system will protect the components and solder joints from a rapid temperature change.

Figure 1:
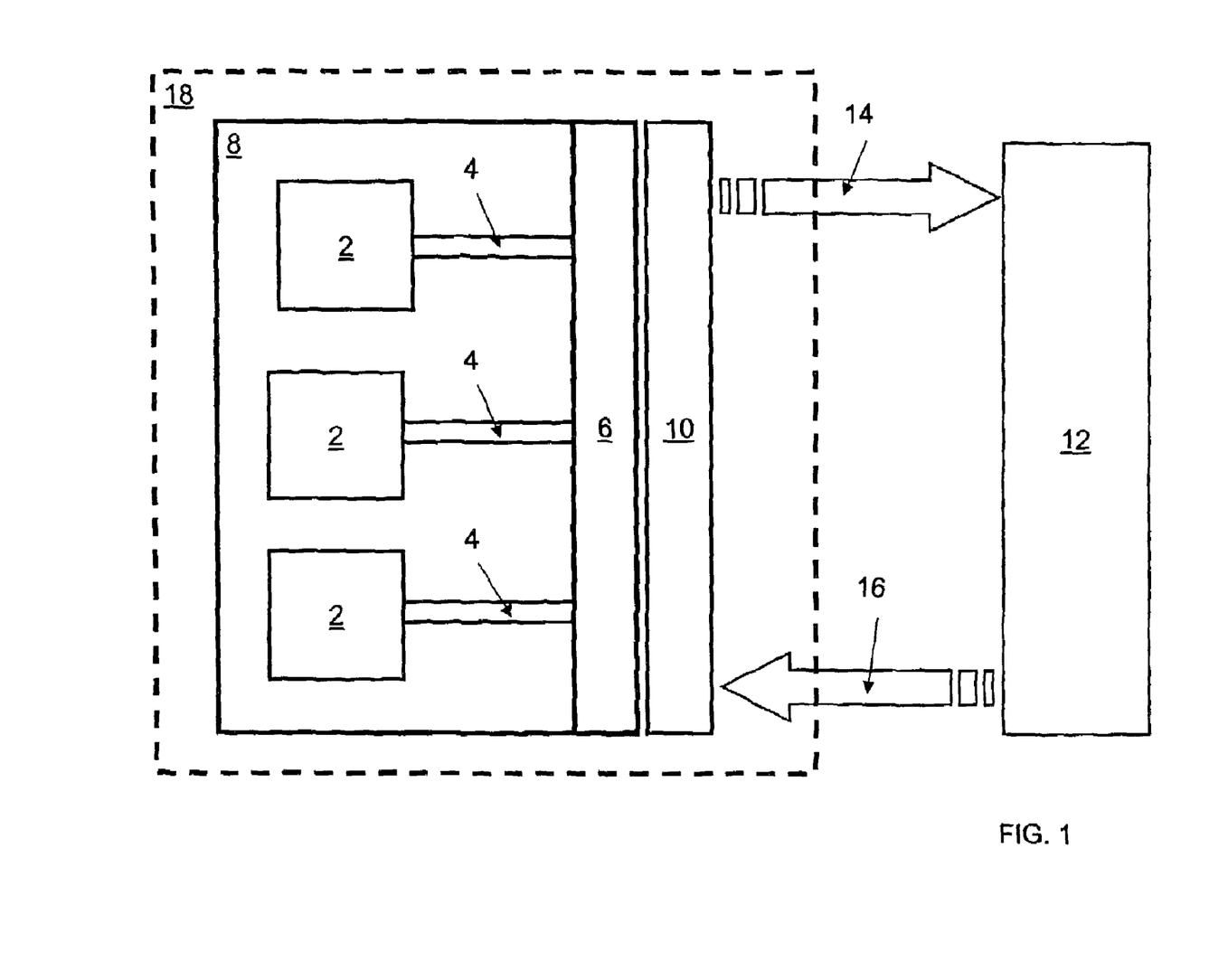
FIG. 1 is a schematical view of a heat exchange system according to the invention.

FIG. 1 is a schematical view of a heat exchange system according to the invention. Heat emitting devices 2, like, e.g., CPUs, are connected by heat pipes 4 to the first or inner heat sink 6 associated to a single server blade 8. FIG. 1 shows the first or inner heat sink arranged on one of the narrow sides of the server blade. However, as already stated above, the first or inner heat sink could also be arranged on both of the narrow sides or on one or both of the broad sides. The first or inner heat sink(s) 6 is (are) connected by thermal contact to the second or outer heat sink(s) 10 which are liquid-cooled by connection to a house service or chiller 12 which provides cooling liquid via pipes 14 and 16 to the rack 18 and the second heat sink(s) 10. Second or outer heat sink 10 is shown as an individual piece for a group of server blades 8.

The second or outer heat sink is located directly below and/or above the blades. Usually, the alignment structure for the blade is mounted at this position. Hence the second or outer heat sink is not only used to remove the heat of the blade (and therefore should have a smooth, big surface), but also for the mechanical alignment of the blade in respect of the blade center. Special profiles of this outer heat sink can improve this alignment-functionality.

Figure 2:
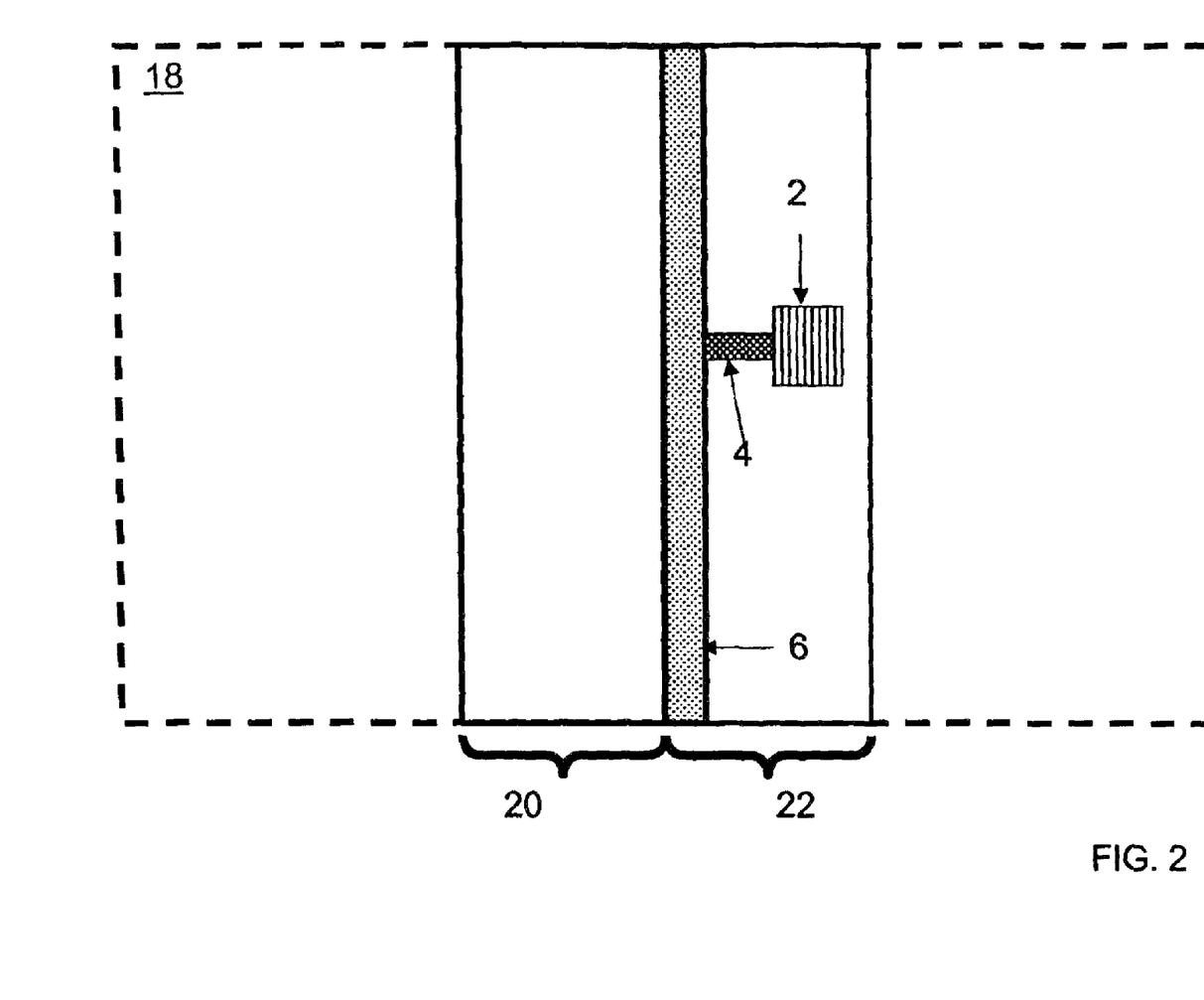
FIG. 2 is a schematical view of a second embodiment of the invention.

FIG. 2 is a schematical view of a second embodiment of the invention. In case the second or outer heat sink is not designed as an integral part of the blade center/rack 18, so-called cool blades or cool slots 20 may be used. Cool blades or slots 20 are designed similar to the high performance (normal) blades 22, but do not contain heat emitting devices like, e.g., CPUs and the like. Instead, the cool blades contain the second or outer heat sink, which is liquid-cooled. Thus, cool blades 20 apply liquid cooling to the blade center without the necessity for the blade center to be modified in any way. Cool blades can be removably mounted at any position and provide imparting, even though limited, hot-plug ability.

Cool blades 20 can be removably mounted at any position in the blade center like any blade. They must be connected to the liquid coolant supply or reservoir. Hence, a cool blade is not hot-pluggable like a normal blade. However, it can be removed and replaced in a few minutes. That means cool blades can be mounted into a normal blade center at dedicated positions.

Then normal blades can be placed into this blade center and can be cooled by the cool blades. At any time the normal blades are hot-pluggable and it is easy to rearrange the cool-blades in the blade center. It is also possible that the cool blades 20 may contain an integrated power supply (not shown) to support the existing power supply in order to get enough power for the normal blades with extreme high computing performance.

Figures 3A, 3B:
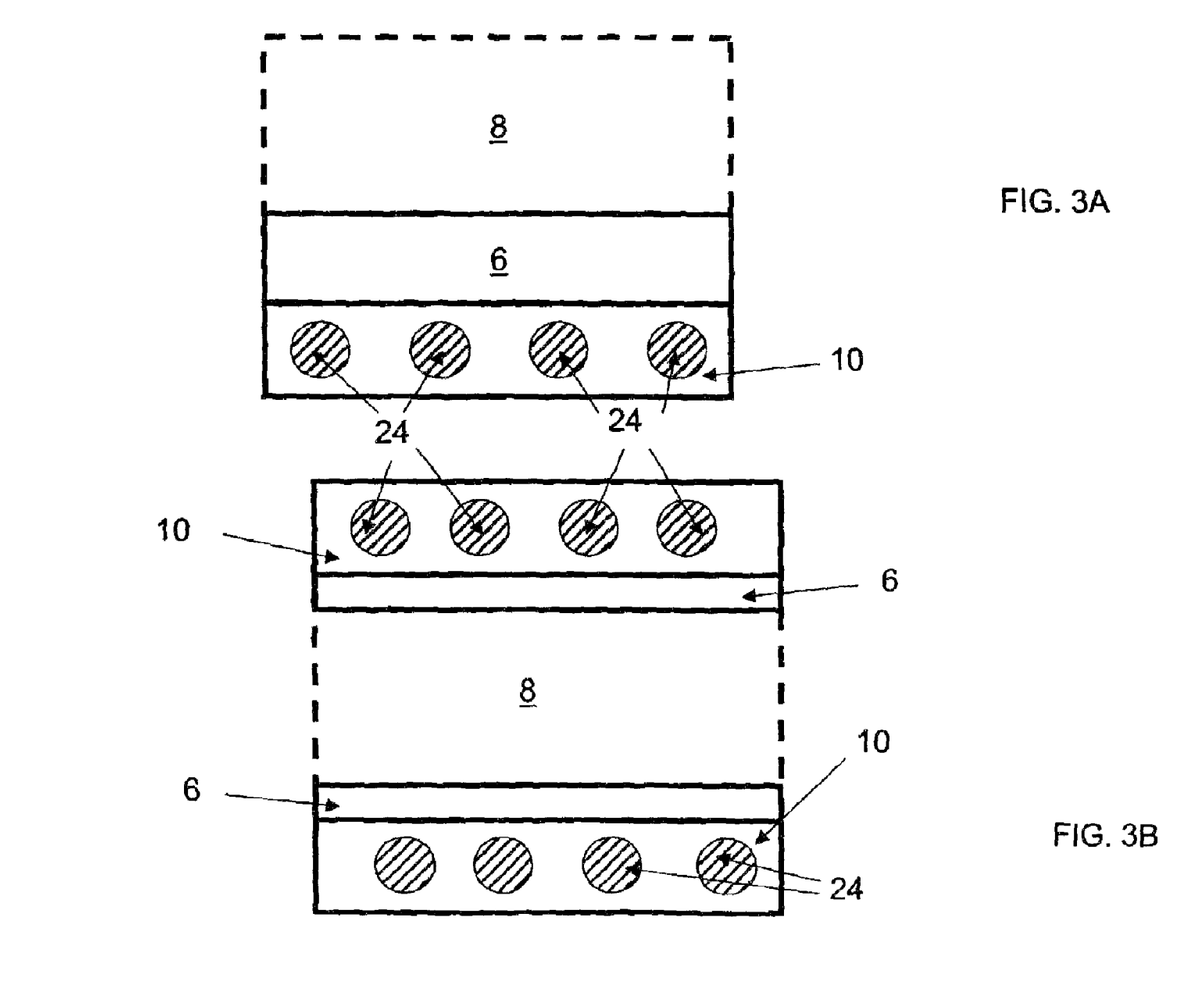
FIGS. 3A and 3B are schematical views of arranging inner and outer heat sinks according to the invention.

FIGS. 3A and 3B are schematical views of arranging first or inner heat sinks 6 and second or outer heat sinks 10 according to the invention. Normally, i.e., if no cool blades or slots are used, the first or inner heat sinks are mounted on the narrow longitudinal edges (lateral surface) of the blade housing and extend along the complete length and height of the housing. One or two inner heat sinks can be alternatively attached on top or at the bottom or simultaneously on both surfaces. Thereby, an inner heat sink always covers the complete edge. FIGS. 3A and 3B also shows the cooling conducts 24 of the second or outer heat sink(s).

Figure 4:
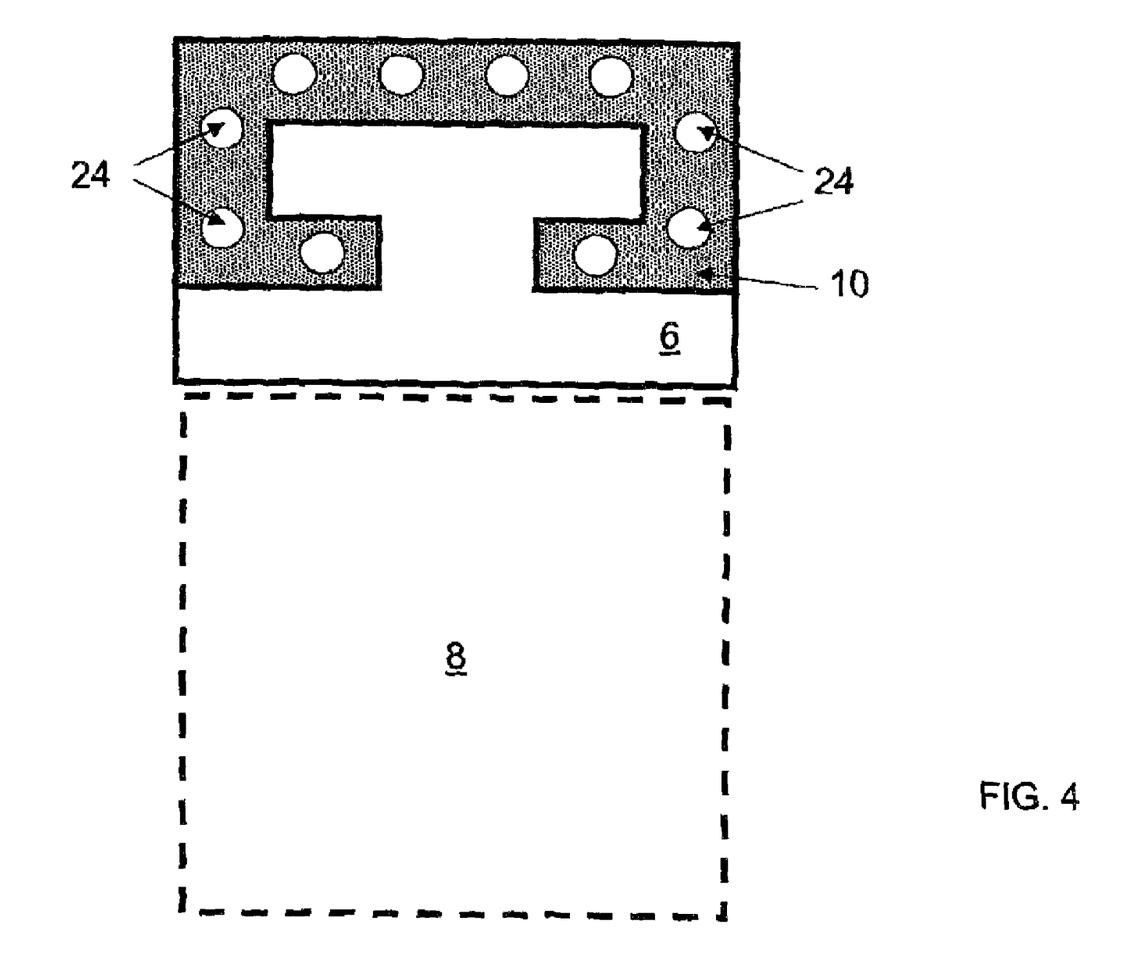
FIG. 4 is a schematical view of another example of arranging inner and outer heat sinks according to the invention.
Figure 5:
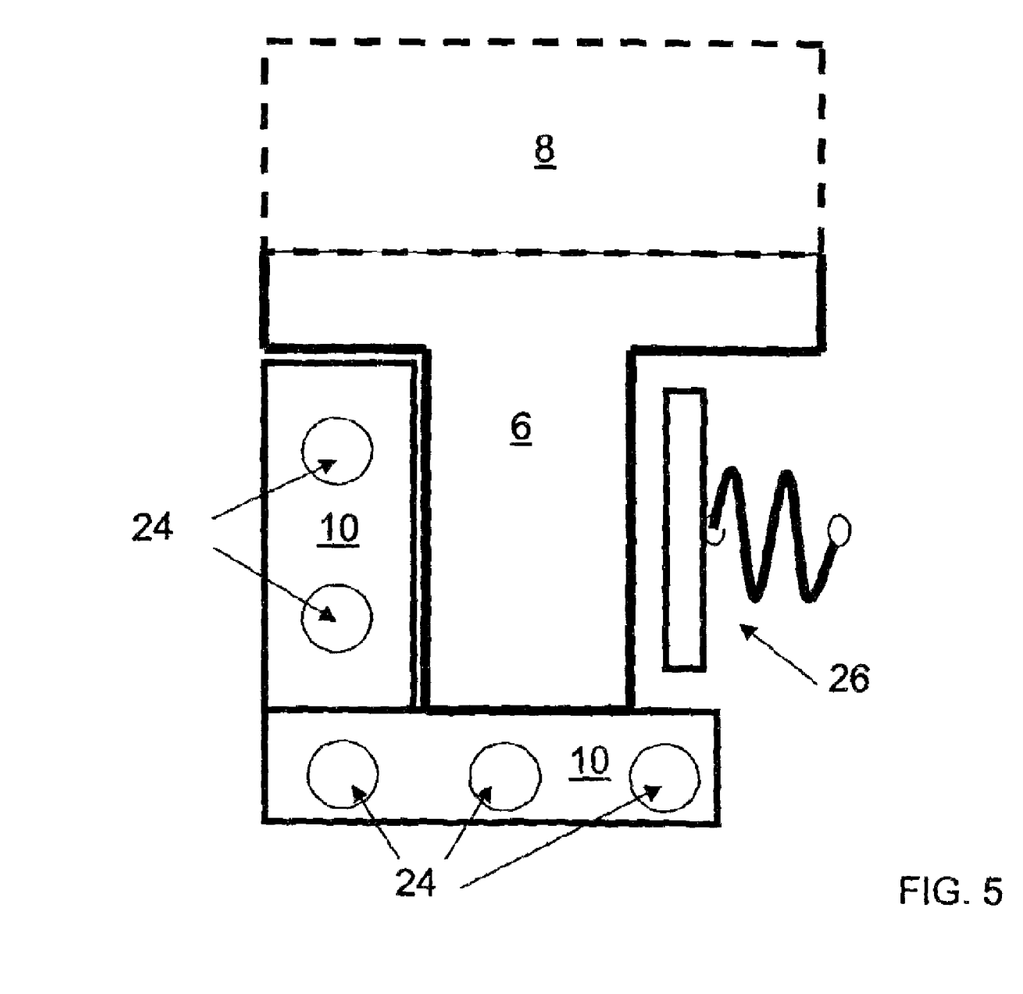
FIG. 5 is a schematical view of yet another example of arranging inner and outer heat sinks according to the invention.

If the blade is inserted upright into the blade center, these edges are situated at the top side or the bottom side of the blade and will serve as a guidance during insertion and fixation of the blade in the blade center. Thus, the first or inner heat sinks are the parts of the blade housing that are always responsible for guidance and fixation. For carrying out this function, a pendulous assembly having a dovetail shaped first or inner heat sink 6 (FIG. 4) or an upright assembly having a base shaped first or inner heat sink 6 (FIG. 5) or a combination of both can be realized. Thereby, the second or outer heat sink 10 constitutes the counterpart of the clamping system to the first or inner heat sink 6. In order to guarantee a selected contact pressure between first or inner heat sink 6 and second or outer heat sink 10, springs 26 or other mechanism can be used besides gravity (dead load), cf. FIG. 5.

Figure 6:
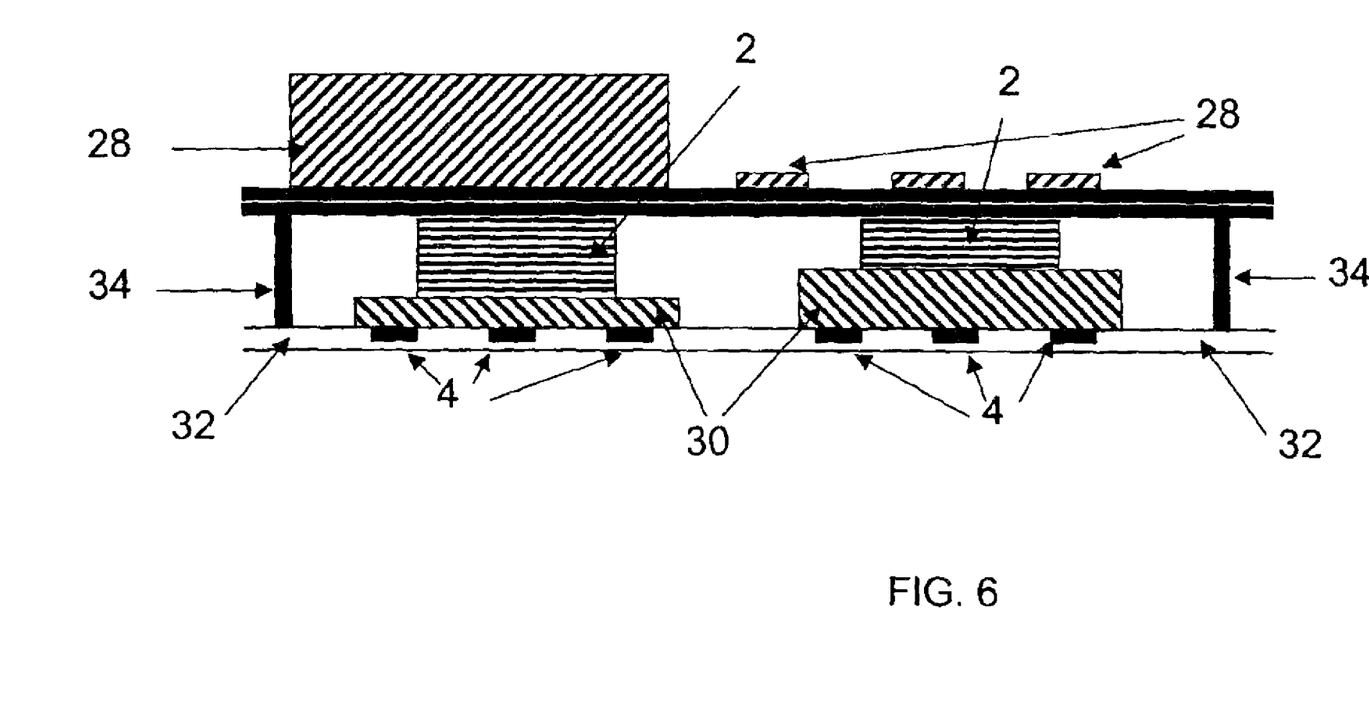
FIG. 6 is a schematical view of an embodiment of the present invention suitable for mass production.

The heat transport from the heat emitting devices (chips) to the first or inner heat sink is ensured via heat pipes which connect the chips with the first or inner heat sink. However, mounting many discrete heat pipes is not suitable for mass production. FIG. 6 shows an embodiment of the present invention where most of the electronic devices 2 to be cooled, e.g., CPUs, etc., are mounted on the back side of the circuit board 28. Heat collectors 30 are mounted on a bottom plate 32 of the server blade 8 at respective locations, e.g., copper blocks which are soldered to the bottom plate. The thickness of the blocks thereby is so designed that the distance between the heat emitting devices 2 and the bottom plate 32 is completely bridged. Spacers 34 maintain the necessary distance between the circuit board 28 and the bottom plate 32. Accordingly, the heat of the heat emitting devices 2 is effectively transferred to the bottom plate 32, where heat pipes 4 are integrated, transmitting the heat to the first or inner heat sinks.

The invention claimed is:

1. Heat exchange system for a server blade arranged in a blade center comprising:
   a upper heat sink extending the entire length of at least one upper lateral edge of the server blade, said upper heat sink having a dovetail portion and is adapted to collect heat emitted from one or more heat emitting devices associated with the server blade;
   a lower heat sink extending the entire length of at least one lower lateral edge of the server blade, said lower heat sink adapted to collect heat emitted from the one or more heat emitting devices;
   means for transferring heat from said heat emitting devices to said upper heat sink and to said lower heat sink; and
   at least one liquid cooled external upper heat sink associated to said blade center, said external upper heat sink having one or more integral guide features to aid in inserting said server blade into said blade center, said integral guide features being counterpart to said dovetail portion;
   at least one liquid cooled external lower heat sink associated to said blade center; and
   whereby said upper heat sink is thermally connected to said external upper heat sink by a contact of said dovetail portion and said integral guide features and whereby said lower heat sink is thermally connected to said external lower heat sink by a spring forced contact of a portion of said lower heat sink to a portion of said external lower heat sink.

2. The heat exchange system of claim 1, wherein said upper heat sink and said lower heat sink form an integral part of said server blade.

3. The heat exchange system of claim 2, wherein said upper heat sink and said lower heat sink are made of aluminum or copper.

4. The heat exchange system of claim 3, wherein said heat emitting devices are processors.

5. The heat exchange system of claim 4, wherein said means for transferring heat are heat pipes.

6. The heat exchange system of claim 5, wherein said heat pipes are a highly thermally conductive material.

7. The heat exchange system of claim 4, wherein said means for transferring heat are solid pieces of copper or aluminum.

8. The heat exchange system of claim 4, wherein said at least one external upper heat sink and said at least one external lower heat sink forms an integral part of the blade center.

9. The heat exchange system of claim 4, wherein said at least one external upper heat sink is removable from the blade center.

10. The heat exchange system of claim 4, wherein said at least one external lower heat sink is removable from the blade center.

11. The heat exchange system of claim 4, wherein said at least one external upper heat sink and said at least one external lower heat sink are made of copper or aluminum.

12. The heat exchange system of claim 4, wherein heat collectors are arranged on a bottom plate of said server blade.

13. The heat exchange system of claim 12, wherein said heat pipes are arranged in said bottom plate.

14. Method for exchanging heat in blade server systems, said blade server systems comprising a server blade arranged in a blade center, said method comprising the steps of:
   associating a upper heat sink to said server blade, said upper heat sink extending the entire length of at least one upper lateral edge of said server blade, said upper heat sink having a dovetail portion and is adapted to collect heat emitted from one or more heat emitting devices associated with said server blade;
   associating a lower heat sink to said server blade, said lower heat sink extending the entire length of at least one lower lateral edge of said server blade, said lower heat sink adapted to collect heat emitted from the one or more heat emitting devices;

transferring heat from said heat emitting devices to said upper heat sink and to said lower heat sink;

associating at least one liquid cooled external upper heat sink to said blade center, said external upper heat sink having one or more integral guide features to aid in inserting said server blade into said blade center, said integral guide features being counterpart to said dovetail portions;

associating at least one liquid cooled external lower heat sink to said blade center;

guiding, against guidance features in said external upper heat sink using said dovetail portion, said server blade during insertion into said blade center;

transferring heat to said external upper heat sink by contacting said dovetail portion and said guidance features; and transferring heat to said external lower heat sink by forcibly contacting a portion of said lower heat sink to a portion of said external lower heat sink using a spring.

15. Method according to claim 14, wherein transferring heat from said heat emitting devices to said upper heat sink and to said lower heat sink is accomplished by heat pipes.

16. Method according to claim 15, wherein said at least one liquid cooled external upper heat sink and at least one liquid cooled external lower heat sink can be inserted at any one or more positions of the blade center.

* * * * *